United States Patent

Sunaga et al.

Patent Number: 6,085,300
Date of Patent: Jul. 4, 2000

[54] DRAM SYSTEM WITH SIMULTANEOUS BURST READ AND WRITE

[75] Inventors: Toshio Sunaga, Kusatsu; Shinpei Watanabe, Yokohama, both of Japan

[73] Assignee: International Business Machines Corporation, Armonk, N.Y.

[21] Appl. No.: 08/934,034

[22] Filed: Sep. 19, 1997

[30] Foreign Application Priority Data

Sep. 27, 1996 [JP] Japan .................................. 8-257127

[51] Int. Cl.⁷ .................................................. G06F 12/00
[52] U.S. Cl. ..................... 711/168; 711/169; 365/189.04; 365/189.05
[58] Field of Search .......................... 365/189.05, 230.03, 365/230.05, 189.04; 711/104, 168, 169

[56] References Cited

FOREIGN PATENT DOCUMENTS

WO 96/20482  7/1996  WIPO ............................ G11C 7/00

OTHER PUBLICATIONS

Sunaga et al.; A Full Bit Prefetch Architecture for Synchronous DRAM's; IEEE Journal of Solid–State Circuits, vol. 30, No. 9, Sep. 1995, pp. 998–1005.

Sunaga; A Full Bit Prefetch DRAM Sensing Circuit; IEEE Journal of Solid–State circuits, vol. 31, No. 6, Jun. 1996, pp. 767–772.

*Primary Examiner*—David L. Robertson
*Attorney, Agent, or Firm*—Robert A. Walsh

[57] ABSTRACT

A DRAM system is described that can prevent a substantial reduction in bandwidth with respect to a clock pulse frequency even when banks are accessed in no specific order. As a result, provided is a memory system constituted by DRAM whereby a seamless operation is assured not only for reading but also for writing.

6 Claims, 4 Drawing Sheets

DRAM SYSTEM WITH SIMULTANEOUS BURST READ AND WRITE

FIELD OF THE INVENTION

The present invention relates to an innovative operation and architecture for a Dynamic Random Access Memory (DRAM) system. More specifically, the present invention relates to an innovative operation and architecture for a DRAM system that fully utilizes the high-band-width capability and enables high speed processing.

BACKGROUND OF THE INVENTION

With DRAM, an inexpensive memory system having a large memory capacity can be constructed by using an extremely simple structure. DRAM is, therefore, the optimal selection for a memory device to be used in a computer system. The transfer speed of DRAM (called the bandwidth, generally represented as a product of a data width and a clock rate) is slower than that of SRAM, another memory device. The bandwidth of DRAM cannot catch up with the enhancement of a recent MPU speed, and becomes one of the barriers to improve the performance of a computer system. Conventionally, various ideas have been provided to improve the bandwidth of DRAM.

Examples are synchronous DRAM (SDRAM) and rambus DRAM (RDRAM), which adopt a system for reading/writing consecutive address data in synchronization with a high speed clock. In a system that uses a high speed clock, theoretically, its input/output section can be operated at 100 to 250 MHz (SDRAM) or at 500 to 600 MHz (RDRAM), which is the operational speed of the clock. However, an activation and precharge operation for a memory array is required for a memory array that is connected to the input/output section. As a result, the bandwidth of the entire memory system, including the input/output section and the memory array, is drastically reduced. For example, when a clock of 200 MHz is employed for SDRAM and when data width is 16 bits (two bytes), a specific value for the bandwidth can be 400 MB/s (400 MB per second). However, if the activation and precharge operation for the memory array is included, the bandwidth is reduced to about one third, 146 MB/s. This is due to the fact that two array activation and precharge operations are required to read/write 4-bit consecutive data, and a period equivalent to 22 clock cycles is spent for these operations. The same thing can be applied for RDRAM. A high speed clock cycle of 500 MHz cannot be employed effectively, and the actual operating speed is reduced to 25% to 40%. For RDRAM, if a hit miss (i.e., miss) occurs, an extremely long time (e.g., 140 ns) is required, and the bandwidth is drastically reduced.

As is described above, the main factor related to the reduction of the bandwidth in a system is the time required for the activation and precharge operation of the memory array. In the above system, therefore, multiple banks (memory array blocks) are prepared, and the activation and precharge operation is performed for each bank, independently. The activation and precharge operation for one bank is being performed while another bank is being accessed, so that the period required for the activation and precharge operation is hidden and the bandwidth is improved. A specific example of such a system is the SyncLink system (NIKKEI MICRODEVICES, August 1995, p. 152). This system independently performs data reading and writing for a memory array that is divided into multiple banks. With this system, however, while a seamless operation is ensured when different banks are sequentially accessed, a seamless operation cannot be provided when the same bank is accessed continuously. This being taken into account, the average data rate is considerably reduced.

To increase processing speed using the conventional methods, it is always premised that different banks will be sequentially accessed. This is because when a specific bank is accessed and continues to be accessed thereafter, the performance of the activation and precharge operation for memory cells in that bank is still required and this processing cannot be hidden. It is well known that data accesses are not always performed alternately for the other banks. Therefore, the above described method, which can be called an alternate bank access system, does not provide an effective resolution for the problem. In addition, the provision of multiple banks adversely affect the installation and product inspection costs, which are not acceptable.

To overcome the shortcoming of the method whereby multiple banks are provided, the present inventors described, in "A Full Bit Prefetch Architecture for Synchronous DRAMs" (IEEE JSSC, Vol. SC-30, No. 9. September 9, 1995, pp. 998–1005) and in Japanese Unexamined Patent Publication No. Hei 07-283849), a system whereby a local latch that is provided for each set of 32 bit lines, of 256 bit lines connected to a memory array, latches a total of eight data bits, and whereby the eight local latches are connected to a local buffer to perform a burst series transfer of data. This reading mechanism is called a prefetch system, because the data are fetched in advance to the local latches. For data reading from SDRAM, this system can satisfactorily compensate for a reduction in the bandwidth, and can provide a seamless operation (provides a condition where there are not unnecessary clock cycles between data transfers). However, with this system a seamless operation is not possible during data writing.

In the article "A Full Bit Prefetch DRAM Sensing Circuit" (IEEE JSSC, Vol. SC-31, No. 6, September 1996, pp. 762–772), a configuration is discussed in which a full burst of read data is latched by an I/O sense amplifier by a single CAS access. With this configuration, the precharging can start two clocks before the data burst cycle begins. Since the precharging can be performed early, during the burst reading of preceding data, the subsequent RAS and CAS accesses can be performed. When eight bits are employed as a burst length, seamless reading can be performed even though the same bank is accessed. With this method, however, the seamless writing cannot be ensured.

SUMMARY OF THE INVENTION

It is therefore an object of the present invention to provide a DRAM system that, with respect to clock pulse frequency, prevents substantial reduction of bandwidth. That is, the object is to provide a memory system that implements bandwidth the equivalent of that for an input/output circuit.

It is another object of the present invention to provide a memory system using DRAM, permitting the system to operate at high speeds even when the banks are to be accessed in no specific order.

It is another object of the present invention to provide a memory system using DRAM whereby a seamless operation is assured not only for reading but also for writing.

It is another object of the present invention to provide a function that can seamlessly perform simultaneous read and write operations.

It is another object of the present invention to provide a DRAM memory system that achieves the other objectives employing an improved prefetch system.

To achieve the above objects, according to the present invention, a prefetch mechanism is applied for writing data to separate memory array at an early stage, so that the activation and precharge operation, which must be done before reading the next set of data from the memory array, does not affect nor cause any deterioration of access speed. An amount of data is prefetched that is twice as much as that fetched in the period represented by an array time constant, so that in a single bank structure a seamless operation can be achieved both for reading and for writing, even when accessed to any row addresses are involved.

More specifically, according to the present invention, provided is a memory system which comprises: a memory array consisting of multiple memory devices, an input data path for inputting external data, an output data path for externally outputting data, an input data bit storage mechanism located between the memory array and the input data path, and an output data bit storage mechanism located between the memory array and the output data path, wherein data bits read from the memory array are held in the output data bit storage mechanism for external output across the output data path; and wherein is done an activation and prefetch operation, which is required for a following data reading from the memory array. In addition, according to the present invention, by using such a memory system, data bits are transferred in advance from a memory array to an output data bit storage mechanism and a first burst output is performed. During this period, an operation required for a following data reading from the memory array is executed, and a next read address is assured. Then, more data bits are transferred from the memory array to the output data bit storage mechanism to perform a second burst output seamlessly, relative to the first burst output. In a write mode, external data bits are stored in input data bit storage means. The procedure at this step can be performed without being affected by the timings for the first and the second burst outputs. This is because the input data bit storage means and the output data bit storage means can be operated independently.

DETAILED DESCRIPTION OF A PREFERRED EMBODIMENT OF THE INVENTION

The condition for implementing a seamless operation must be the condition that exists when a sum of an RAS-CAS delay ($t_{RCD}$) and an RAS precharge time ($t_{RP}$) is smaller than a burst length ($L_B$), i.e., $$t_{RCD} + t_{RP} < L_b \quad (1)$$

These times are actually represented by a number of clock cycles. Even when data accesses are performed between any row addresses at this time, a seamless operation can be assured. That is, even when an activation and precharge operation for a memory array is included, continuous reading/writing can be performed.

Since $t_{RCD} + t_{RP}$ on the left side of the above expression represents the minimum period of time required for accessing the memory array, this value is called an array time constant. Assuming that reading and writing are alternately performed during regular processing, the actual condition for the seamless operation can be defined as:

$$2(t_{RCD} + t_{RP}) < L_B \quad (2)$$

To provide the above condition, according to the present invention, in the memory system using DRAM, the memory array and the data input/output circuits are connected together by a latch, etc., and their operations can be separated. Further, the input circuit and the output circuit are provided separately to ensure independent operations, and reduction of the bandwidth does not occur while reading and writing are repeated alternately.

Figure 1:
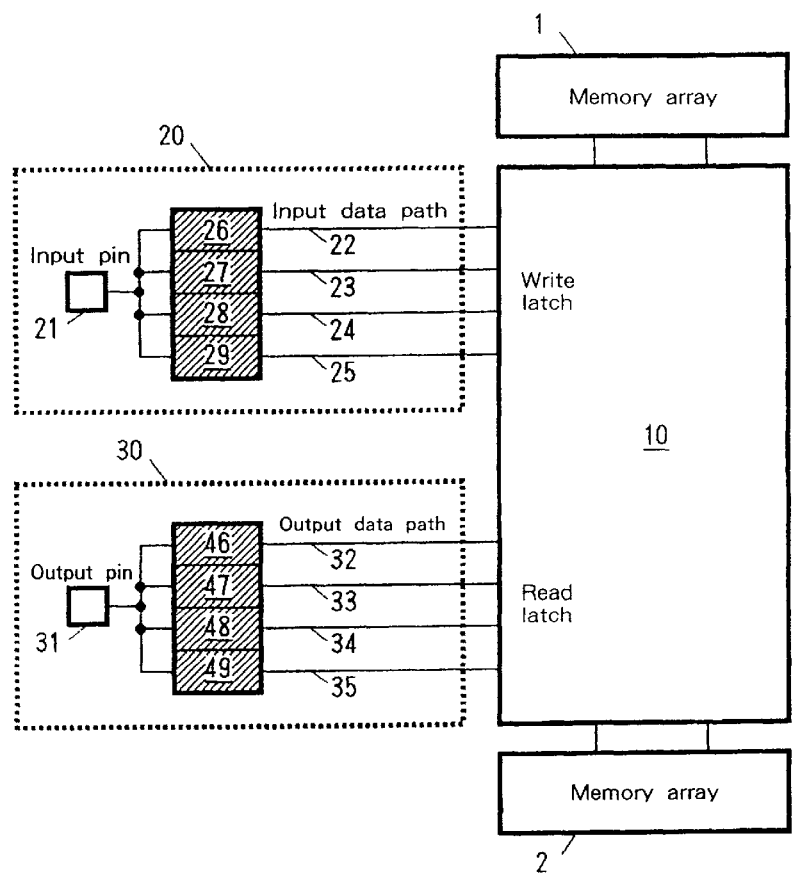
FIG. 1 is a diagram illustrating a memory system according to the present invention.

FIG. 1 is a diagram illustrating one embodiment of the present invention. Memory arrays 1 and 2 are connected to an input circuit 20 and an output circuit 30 via a read/write latch 10. The input circuit 20 and the output circuit 30 are connected to external devices via a receiver and an input pin 21, and via an output buffer and an output pin 31 respectively. Four input latches 26, 27, 28 and 29 are provided for data input and four output latches 46, 47, 48 and 49 are provided for data output. These input latches are constituted by multiple input data paths 22, 23, 24 and 25, and the output latches are constituted by multiple output data paths 32, 33, 34 and 35.

Figure 2:
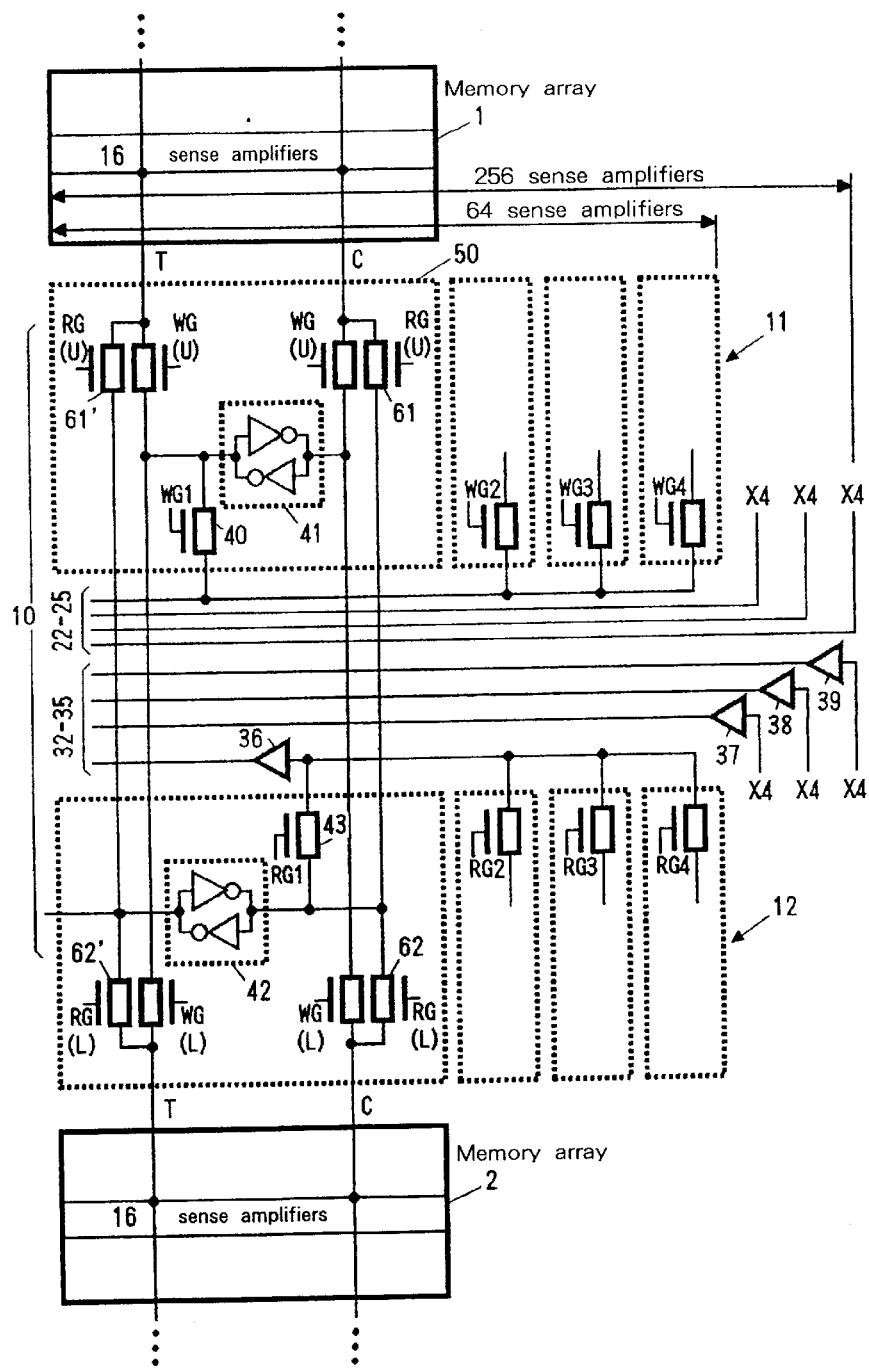
FIG. 2 is a diagram illustrating the details of the memory system shown in FIG. 1.

FIG. 2 is a diagram illustrating the details of the circuit shown in FIG. 1. The read/write latch 10 is actually separated into read latches 12 and write latches 11. Each set of four latches is connected to one of the data paths 22 to 25, and the data paths 32 to 35. In this embodiment, since four data paths are employed for reading and four for writing, and since four latches are connected to each data path, sixteen write latches and sixteen read latches are distributed among 256 bit lines. In other words, one latch is provided for every 16 bit lines.

The number of latches to be allocated for each bit line set of the 256 bit lines is determined by the time array constant and the clock frequency. For a common 16 to 64 MB DRAM, the array time constant is 32 ns. When the data clock frequency is 250 MHZ (4 ns), from the above expression (2) is apparent that only a 16-bit burst transfer need be performed. To do this, 16 latches must be provided for each bit line set of the 256 bit lines, and must prefetch to prepare for a 16-bit burst transfer. As is described above, the arrangement in FIG. 2 is only an example acquired by employing a specific array time constant and a specific clock frequency. The present invention is not limited to the arrangement in FIG. 2.

In this invention, an activation and precharge operation for a memory array is performed while data are being latched. This is the same as the above described background art. In the configuration in FIG. 2, 16 bits are latched during an array time constant period of 32 ns. Every 16 ns the latches output one bit set having a 4-bit width to each of the four output data paths via read buffers 36, 37, 38 and 39, which are connected to the respective output data paths 32 to 35. And every 4 ns (250 MHZ) the data are output to the exterior across the output data paths by using the output latches and the output buffers. In this manner, the 16-bit burst output can be completed within a total of 64 ns, and expression (2) can be satisfied.

For a write mode, the 4-bit latches 26, 27, 28 and 29 shown in FIG. 1 are provided for input. The 4-bit latches drive the input data paths every 16 ns to store bit sets having a 4-bit width in the write latch 11. When all 16 bits have been stored, data writing to the memory array is performed.

Figure 3:
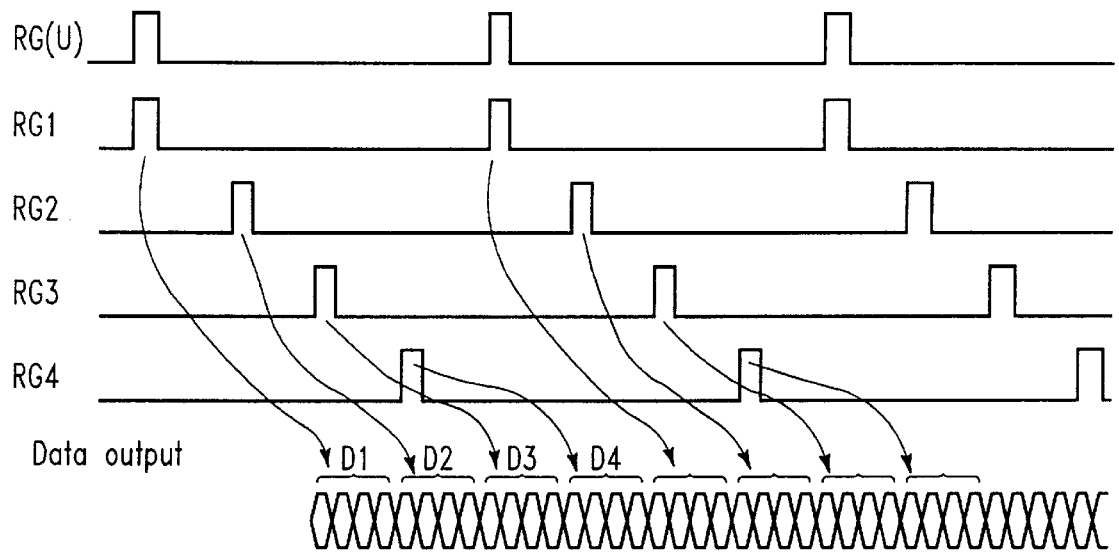
FIG. 3 is a timing chart for a read operation performed by the memory system according to the present invention.

The processing for the circuit in FIG. 2 will now be described in detail. In a read mode, a switch RG(U) 61 or a switch RG(L) 62 goes high. When the switch RG(U) 61 goes high, the memory array 1 is selected. When the switch RG(L) 62 goes high, the memory array 2 is selected. FIG. 3 is a timing chart in a read mode when the switch RG(U) 61 goes high. Since the switch RG(U) 61 goes high, the TRUE(T)/COMPLEMENT (C) line of a sense amplifier connected to the memory array 1 is connected to the read latch 42 across the switch RG(U) 61. Since the switch RC(L) 62 does not go high, the memory array 2 is not connected to the read latch 42. In this condition, 1-bit data from the sense amplifier is latched in advance by the read latch 42. A read latch 42 is provided for every 16 bits of the sense amplifier, and a total of sixteen bits are provided for a memory array (256 bit width). As is described above, one of the read buffers 36, 37, 38 and 39 for external output are provided for every 64 bits, and are connected to the read latches via switch RG1, RG2, RG3 and RG4 (not shown except for the latch 42). Hereinafter, a sense amplifier unit of 64-bit lines is called a block for convenience sake.

By employing the block concept, the present invention is configured as follows. The sense amplifier having a 256 bit width is constituted by four blocks having 64 bit widths. The buffers 36, 37, 38 and 39 are respectively connected to the four blocks for outputting. These buffers can increase the driving force for the output, but for them to perform the latch bit function is not inevitable. Each block has four read latches 42. The four read latches 42 are connected to one data path (e.g., the data path 32) across a connected buffer to each block and to the switches RG1, RG2, RG3 and RG4. The switches RG1, RG2, RG3 and RG4 go high sequentially at intervals one quarter the length of the cycle time required for the switch RG(u) to go high, as is shown by the timing chart in FIG. 3. When the switch RG1 goes high, for example, bits stored in the read latch 42 (D1) are output externally from the buffer 36. Then, the switch RG 2 goes high, and bits stored in the connecting read latch 42 (D2) are output externally from the buffer 36.

This process is repeated for the switched RG3 and RG4, and data D3 and D4 are output externally via the buffer 36. This operation is performed for each block. Since there are four blocks in the memory array (256 bit width) and four corresponding buffers and data paths are arranged, data are output externally as units of four bits, as is shown in FIG. 3. More specifically, in respective blocks, corresponding data to the condition where the switch RG 1 goes high are output in parallel through the respective buffers 36, 36, 38 and 39 by the output latches 46, 47, 48 and 49 that are connected to the buffers. As is shown in FIG. 1, since the data from the output latches 46, 47, 48 and 49 are finally output externally through one output pin 31, four sets of parallel data are output externally in a burst mode while timings are gradually delayed by using a clock four times as fast.

Figure 4:
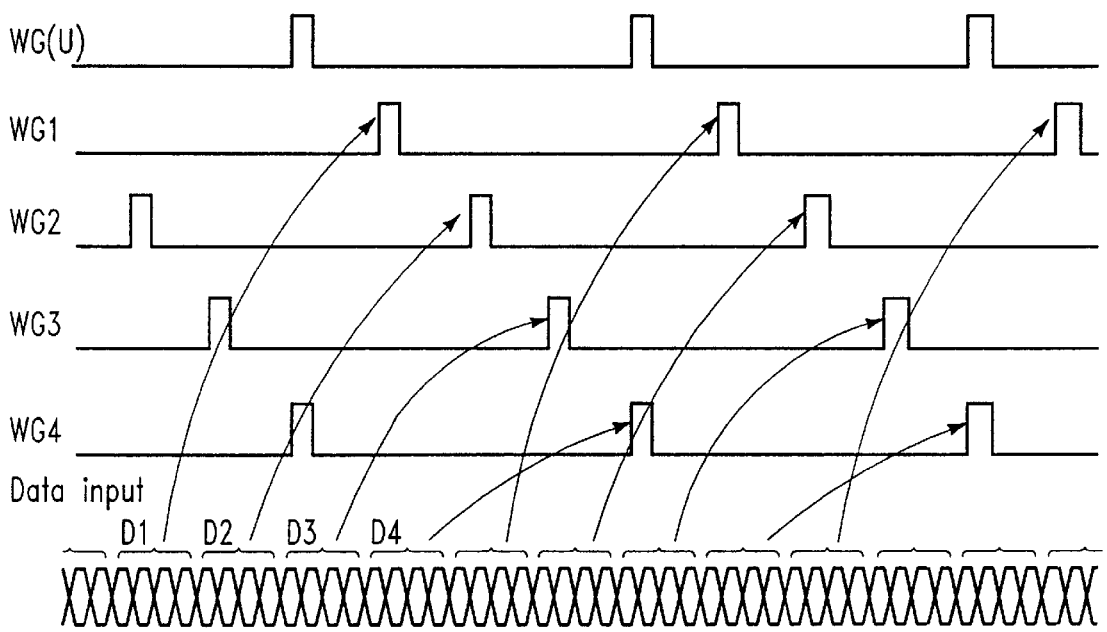
FIG. 4 is a timing chart for a write operation performed by the memory system according to the present invention.

The write mode will now be described. In the write mode, data are input in advance to the input latches 26, 27, 28 and 29 at a timing four times as fast. As switches WG1, WG2, WG3 and WG4 go high sequentially, as is shown in FIG. 4, four bits of data are stored in the write latch 41 and in corresponding write latches (not shown) in the other blocks. More specifically, there are four blocks in the memory array and they are connected to the data paths 22, 23, 24 and 25 respectively. The four switches WG1, WG2, WG3 and WG4 are connected to each data path. Therefore, when the switch WG1 goes high relative to the data paths 22, 23, 24 and 25, as is shown in FIG. 4, 4 bits of data (D1) are stored in each of the four write latches. This process is repeated as the switches WG2, WG3 and WG4 go high in order, and a total of 16 bits of data are stored, one to each of the 16 write latches. When the switch WG(U) goes high after this processing sequence has been completed, 16 bits of data are stored in the memory array in a burst mode. As is shown in FIG. 4, since all of the data bits are stored in the write latches at the same time as the switch WG4 goes high, the switch WG(U) can go high at the same time the switch WG4 goes high.

Figure 5:
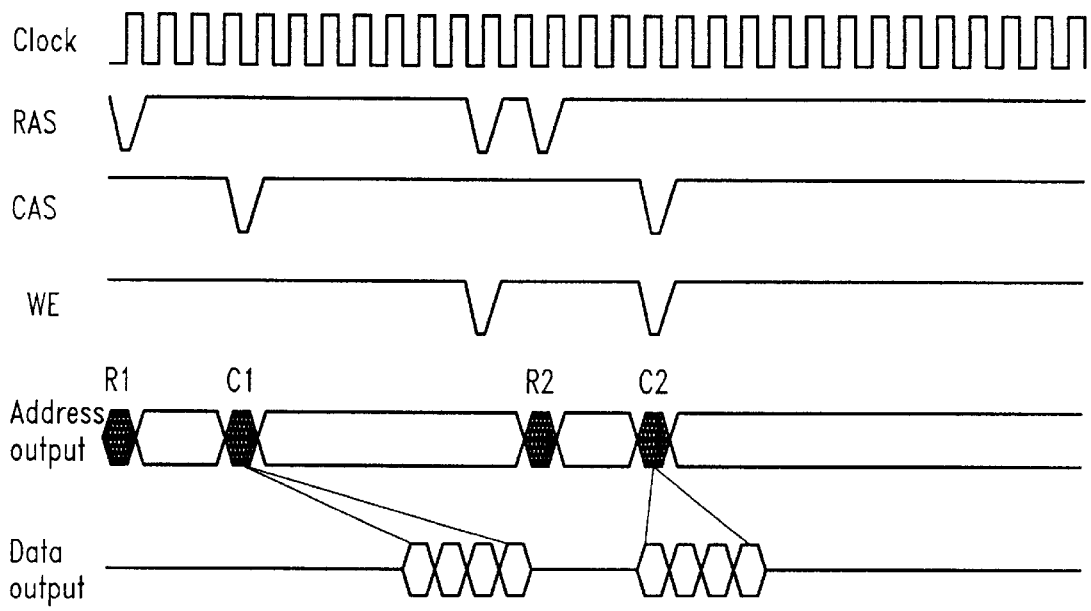
FIG. 5 is a timing chart for the processing of a conventional SDRAM system.
Figure 6:
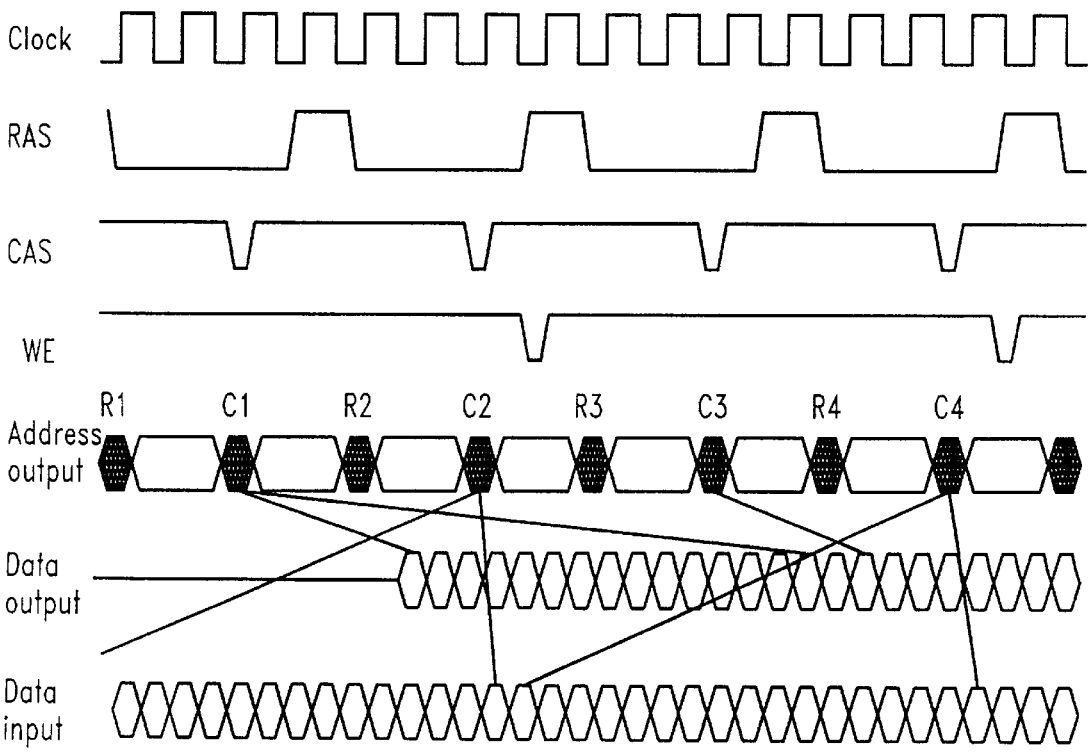
FIG. 6 is a timing chart for the processing of the memory system according to the present invention.

FIG. 6 is a timing chart for explaining the operation of a DRAM system according to the present invention, compared with a convention SDRAM system (FIG. 5). The burst length for the conventional SDRAM system is four and the burst length for the DRAM system of the present invention is sixteen, as a clock frequency for both of them is 125 MHz.

Referring to FIG. 5, in the SDRAM, row address R1 and column address C1 are determined by the leading edges (activation) of RAS and CAS. Based on these addresses, four data bits are output continuously in a burst mode. But when a 4-bit burst has been completed, ads the activation and precharge operation for a memory array takes much time, the designation of the next row address R2 and column address C2 is delayed. Therefore, a succeeding 4-bit burst cannot be performed following a preceding 4-bit burst. That is, when the same bank is accessed, a seamless operation cannot be performed.

Referring to FIG. 6, for the DRAM, the row address and the column address are designated by the leading edges of the RAS and CAS. Data reading begin in a 16-bit burst mode based on the first address (R1, C1). As is described above, the 16-bit burst is performed by a read latch group that operates separately from the memory array. During the 16-bit burst transfer, operations required for the next burst transfer, such as an activation and precharge operation for a memory array, can be performed. These memory operations are completed when the address (R3, C3) for a following data reading is designated, because the period required for the 16-bit burst satisfies the above expression (1).

When the access is only for reading, a seamless operation can be assured with a shorter burst length than the timing shown in FIG. 6. However, actually the writing operation is also performed as needed in addition to the reading. In the present invention, expression (2) where the burst length is longer than that in expression (1) is employed. Then, an address for writing can be specified during the read data burst transfer, and writing can be performed at the same time as the burst transfer for reading. Referring to FIG. 6, the reading burst transfer address is specified by the row address R1 and the column address C1. Before the burst transfer is completed, burst transfer addressed R3 and C3 for a following data reading are designated, and the burst transfer addresses R2 and C2 for writing are selected. Thus, even when the writing operation is interrupted during the burst transfer for reading, the reading operation will not be halted. This is because the burst length that satisfied the expression (2) is employed, and because the mechanism for independently performing the reading and writing is employed. The read latch 11 and the write latch 12 are designed to be operated independently in order to separately perform the reading and writing operations.

According to the present invention, provided is a DRAM system that can prevent substantial reduction in bandwidth with respect to a clock pulse frequency even when banks are accessed in no specific order. As a result, provided is a memory system constituted by DRAM whereby a seamless operation is assured not only for reading but also for writing.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A memory system having read and write operations, comprising:

a memory array including a plurality of memory devices;

an input data path for inputting external data;

an output data path for externally outputting data;

an input data bit storage mechanism located between said memory array and said input data path; and an output data bit storage mechanism located between said memory array and said output data path, in which data bits read from said memory array are held in said output data bit storage mechanism for output externally across said output data path such that a process required for an immediately following data reading in said memory array is performed, and said input data bit storage means and said output data bit storage means can be operated independently whereby the read and write operations are done simultaneously.

2. The memory system according to claim 1, wherein external data is held in said data bit storage mechanism via said input data path, and is then written to said memory array.

3. A data transfer method for exchanging data with an external device, for a memory system having read and write operations that includes a memory array having a plurality of memory devices, an input data path for inputting external data, an output data path for externally outputting data, an input data bit storage mechanism located between said memory array and said input data path, and an output data bit storage mechanism located between said memory array and said output data path, comprising the steps of:

prefetchinig data bits from said memory array to said output data bit storage mechanism and of performing a first burst output;

performing an operation required for a following data reading in said memory array, and of acquiring a following read address during said first burst output; and transferring more data bits from said memory array to said output data bit storage mechanism to perform a second burst output relative to said first burst output whereby read and write operations are done simultaneously.

4. The data transfer method according to claim 3, whereby said burst transfer bit length is set so that a relationship between an array time constant ($t_1$), which is a period needed for an operation required for a following data reading in said memory array, and a period ($t_2$), which is needed during performance of a burst transfer in accordance with a predetermined burst transfer bit length, is $2t_1 < t_2$.

5. A data transfer method for exchanging data with an external device, for a memory systeni having read and write operations that includes a memory array having a plurality of memory devices, an input data path for inputting external data, an output data path for externally outputting data, an input data bit storage mechanism located between said memory array and said input data path, and an output data bit storage mechanism located between said memory array and said outptit data path, comprising the step:

prefetching data bits from said memory array to the output data bit storage mechanism and of performing a first burst output;

performing an operation required for a following data reading in said memory array, and of acquiring a following read address during said first burst output;

transferring more data bits from said memory array to said output data bit storage mechanism to perform a second burst output relative to said first burst output;

storing external data bits in said input data bit storage means; and storing in said memory array data bits received from said input data bit storage means, whereby read and write operations are done simultaneously.

6. The data transfer method according to claim 5 whereby a process at said step for storing in said memory array data bits received from said input data bit storage means is performed independently without being affected by the operation said first and said second burst outputs.

* * * * *